(12) United States Patent
Wong et al.

(10) Patent No.: US 7,884,361 B2
(45) Date of Patent: Feb. 8, 2011

(54) PATTERN-PRINT THIN-FILM TRANSISTORS WITH TOP GATE GEOMETRY

(75) Inventors: William Wong, San Carlos, CA (US); Rene Lujan, Sunnyvale, CA (US); Eugene Chow, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/817,127

(22) Filed: Jun. 16, 2010

(65) Prior Publication Data

US 2010/0252927 A1    Oct. 7, 2010

Related U.S. Application Data

(62) Division of application No. 12/018,794, filed on Jan. 23, 2008, now Pat. No. 7,804,090, and a division of application No. 11/193,847, filed on Jul. 28, 2005, now Pat. No. 7,344,928.

(51) Int. Cl.
*H01L 21/00* (2006.01)
(52) U.S. Cl. .................. 257/57; 257/59; 257/E29.117; 257/E29.29; 257/E21.412; 438/151
(58) Field of Classification Search .................. 257/57, 257/59, E29.117, E29.29, E21.412; 438/151, 438/161
See application file for complete search history.

(56) References Cited

U.S. PATENT DOCUMENTS

| | | | |
|---|---|---|---|
| 3,958,252 A | 5/1976 | Kashio | |
| 4,131,899 A | 12/1978 | Christou | |
| 4,788,157 A | 11/1988 | Nakamura | |
| 4,959,674 A | 9/1990 | Khri-Yakub et al. | |
| 5,733,804 A | 3/1998 | Hack et al. | |
| 5,958,122 A | 9/1999 | Fukuda et al. | |

(Continued)

FOREIGN PATENT DOCUMENTS

WO    WO 00/59027 A1    10/2000

(Continued)

OTHER PUBLICATIONS

EPO- European Search Report, for corresponding European patent application, No. EP 06117533, search report dated Jan. 17, 2008 (5 pages).

*Primary Examiner*—Minh-Loan T Tran
(74) *Attorney, Agent, or Firm*—Jonathan A. Small

(57) ABSTRACT

A self-aligned, thin-film, top-gate transistor and method of manufacturing same are disclosed. A first print-patterned mask is formed over a metal layer by digital lithography, for example by printing with a phase change material using a droplet ejector. The metal layer is then etched using the first print-patterned mask to form source and drain electrodes. A semiconductive layer and an insulative layer are formed thereover. A layer of photosensitive material is then deposited and exposed through the substrate, with the source and drain electrodes acting as masks for the exposure. Following development of the photosensitive material, a gate metal layer is deposited. A second print-patterned mask is then formed over the device, again by digital lithography. Etching and removal of the photosensitive material leaves the self-aligned top-gate electrode.

5 Claims, 17 Drawing Sheets

U.S. PATENT DOCUMENTS

| | | |
|---|---|---|
| 6,116,718 A | 9/2000 | Peeters et al. |
| 6,310,670 B1 | 10/2001 | Lee |
| 6,742,884 B2 | 6/2004 | Wong et al. |
| 6,872,320 B2 | 3/2005 | Wong et al. |
| 7,459,400 B2 | 12/2008 | Arias et al. |
| 2004/0002225 A1 | 1/2004 | Wong et al. |
| 2005/0136358 A1 | 6/2005 | Paul et al. |

FOREIGN PATENT DOCUMENTS

| | | |
|---|---|---|
| WO | WO 01/15234 A1 | 3/2001 |

PATTERN-PRINT THIN-FILM TRANSISTORS WITH TOP GATE GEOMETRY

CROSS-REFERENCE TO RELATED APPLICATIONS

This application is a divisional application of co-pending application Ser. No. 12/018,794, which is itself a divisional application of application Ser. No. 11/193,847 (now U.S. Pat. No. 7,344,928), each of which being incorporated by reference herein and to which priority is hereby claimed.

STATEMENT REGARDING FEDERALLY SPONSORED RESEARCH AND DEVELOPMENT

This invention was made with U.S. Government support under the contract identified as Govt NIST/Varian 70NANB3H3029 Novel x-Ray. The U.S. Government has certain rights in this invention.

BACKGROUND OF THE INVENTION

1. Field of the Invention

The present invention is generally related to micro-electronic devices, and more specifically related to thin-film transistors with a gate region located above the source and drain regions formed on a substantially transparent substrate, and methods and apparatus for manufacturing same.

2. Description of the Prior Art

Many current designs for thin film transistor (TFT) arrays, such as displays, require that each pixel be transmissive and backlit, requiring a transparent substrate. However, the silicon substrate typically used in semiconductor device manufacturing is opaque crystalline silicon. Accordingly, hydrogenated amorphous silicon (a-Si:H) and recrystallized silicon devices have been developed which may be formed for example on a transparent glass substrate. The following description will focus on a-Si:H, although it will be understood that other materials are also contemplated herein.

Current methods for manufacturing arrays of a-Si:H TFTs typically begin with the deposition of a metal on the substrate on which a layer of a-Si:H is deposited. Additional layers of conducting and insulating materials are formed and patterned by photolithographic processes to create source, gate and drain regions for each TFT. These photolithographic processes typically involve the deposition of layers of photosensitive or photoresistive materials. The photoresistive materials are exposed through a mask, developed to remove portions of the materials, then the structure is etched to remove portions of the conducting and/or insulating layers not protected by the remaining photoresistive materials, to thereby form electrically connected and isolated or semi-isolated regions. Through multiple photolithographic and deposition steps, an array of layered semiconductor devices and interconnections may be formed on the transmissive substrate.

The specific techniques described above have been refined such that they now typically provide very high yield. However, there remains pressure on manufacturers to reduce cost of manufacturing. One significant expense in the manufacturing process is the photolithography, which requires critically precise alignment of the masks for each layer of the device, therefore requiring manufacturers to use expensive and sensitive alignment tools during device manufacturing. Furthermore, development of the photoresistive materials requires expensive and often harsh and environmentally unsafe chemical treatments.

In order to address the need to reduce the cost of those parts of the manufacturing process related to photolithography, a print-like processes using phase change materials have been developed. For example U.S. Pat. Nos. 6,742,884 and 6,872,320 (each incorporated herein by reference) teach a system and process, respectively, for direct marking of a phase change material onto a substrate for masking. According to these references, a suitable material, such as a stearyl erucamide wax, is maintained in liquid phase over an ink-jet style piezoelectric print head, and selectively ejected on a droplet-by-droplet basis such that droplets of the wax are deposited in desired locations in a desired pattern on a layer formed over a substrate. The droplets exit the print head in liquid form, then solidify after impacting the layer, hence the material is referred to as phase-change.

One disadvantage of this process is that due to the relatively large drop size, on the order of 20-40 micrometers in diameter, device features manufactured by this process tend to be relatively large. For example, by depositing a series of phase-change material droplets onto a semiconductive layer such that when hardened they form a linear feature, then etching the metal layer apart from where the layer is covered by the phase change material, the channel for a transistor may be formed. The length of the channel is directly related to the diameter of the droplets, in this case a minimum of 20-40 microns. However, modern pixel size and device performance requirements for low mobility materials such as a-Si:H mandate much smaller channel lengths, for example on the order of 5-15 microns. While it is known that available printing systems are capable of very accurate drop placement, the relatively large drop size has heretofore precluded producing high performance devices Accordingly, the present invention provides a method and apparatus for manufacturing a thin-film transistor on a transmissive substrate having smaller feature sizes than heretofore possible.

Additionally, overlap between the gate electrode on the one hand and the source and drain electrodes on the other hand lead to parasitic capacitance in TFTs, which degrades device performance. Methods have been developed for self-aligning the gate electrode with the channel boundaries in traditional photolithographic processes. See, for example, U.S. Pat. No. 5,733,804 (which is incorporated by reference herein). However, the aforementioned expense of the traditional photolithograph remains a disadvantage of this process.

Accordingly, the present invention further provides a method and apparatus for manufacturing a thin-film transistor on a transmissive substrate having a self-aligned channel and gate electrode. These and other objects and advantages of the present invention will become apparent from the description, claims, and figures which follow.

SUMMARY OF THE INVENTION

Accordingly, the present invention is directed to a thin-film transistor formed on a transmissive substrate having reduced feature size, self-aligned channel and gate electrode, and methods and apparatus for manufacturing same. In order to provide same, according to one embodiment of the present invention, an a-Si:H channel device, formed on a glass substrate, is constructed with a top gate electrode. The source and drain electrodes form the masks for back side exposure of photoresist. Subsequent etching defines a channel region and gate electrode with minimal overlap of the source and drain electrodes without the need for elaborate alignment and photolithography.

Initially, devices according to the present invention are produced using an etching mask formed by a system which deposits a masking material at least substantially in liquid form that solidifies on the surface on which it is deposited. Such systems include droplet ejection systems, such as: ink-jet systems (such as disclosed in U.S. Pat. No. 4,131,899, which is incorporated herein by reference), ballistic aerosol marking (BAM) devices (such as disclosed in U.S. Pat. No. 6,116,718, which is incorporated herein by reference), acoustic ink printer (AIP) systems (U.S. Pat. No. 4,959,674, which is incorporated herein by reference), carrier-jet ejectors (as disclosed in U.S. Pat. No. 5,958,122, which is incorporated by reference herein), deflection-controlled ink-jet systems (such as disclosed in U.S. Pat. No. 3,958,252, which is incorporated herein by reference), etc. Such systems also include pattern transfer systems, such as: xerographic, ionographic, screen, contact, and gravure printing systems, etc. For the purposes of the present description, such systems will collectively be referred to as "digital lithographic" systems, and the process of their use referred to as "digital lithography". Importantly, such systems are distinct from traditional lithographic systems, usually referred to as photolithographic systems, in that no reticle or mask, nor processes associated therewith, are required for digital lithography. By combining printed etch masks with digital imaging and processing digital lithography can be used to register virtual masks for TFT device patterning. The ability to correct the alignment of the mask layer through image processing prior to patterning is a significant advantage of the digital-lithographic process over other patterning methods. In this process, layer registration is performed by first positioning the process wafer roughly in the orientation of the previously defined layer. The coordinates of alignment marks are then obtained through image capturing of the surface topography using a camera attached to a microscope objective. Once the coordinates are obtained, the mask layer is then digitally processed, repositioned, and aligned to the process wafer prior to printing the mask pattern, eliminating the need to manipulate optics or mechanically adjust a mask aligner and process wafer.

However, since the width of digital lithographic masking elements, such as droplet diameters, produced by such systems are typically much larger (e.g., on the order of 20-50 microns) than the features to be formed from the etching process (e.g., channels for TFTs, which are typically on the order of 5-15 microns in width for low mobility materials such as a-Si:H), masking elements from such systems do not make optimal feature masks. Accordingly, the masking elements are not used to directly mask features such as the channel regions. Since it is possible to deposit masking elements using such systems with gap spacing between elements smaller than the masking element widths, the channel is formed in the interstices between regions masked by the masking elements. Thus, as more particularly described herein, channel material regions may be formed with widths in the range of 5-15 microns.

More particularly, the method according to the present invention begins with the deposition of a source and drain electrode metal layer, such as chrome (Cr), over a glass substrate. A contact layer, such as n+-Si is then formed over the metal layer. A first patterned mask is then formed over the contact layer by digital lithography, comprised of a phase change material such as stearyl erucamide wax (for example, Kemamide 180-based wax from Xerox Corporation of Stamford, Conn.). According to an illustrative embodiment, such material is deposited using a droplet ejector, such as an ink-jet type piezoelectric ejector, although it will be appreciated that any other of a variety of digital lithographic systems and processes may be employed. The temperature of the substrate may be controlled in order to control the mask element sizes formed by the droplets. The contact and metal layers are then etched to form source and drain electrodes.

A semiconductive layer, such as a-Si:H is next formed, and an insulative layer, such as $Si_3N_4$, is formed thereover. A layer of photosensitive material, such as a positive photoresist, is next formed over the surface of the insulative layer. This photosensitive layer is then exposed from the back side of the device by illuminating through the substrate. In this way, the source and drain electrodes act as masks for the exposure. The photoresist layer is then developed, leaving islands of photoresist aligned to the source and drain electrodes. A gate metal layer is next deposited over the device. A second patterned mask is then formed over the device, again by digital lithography. An etch is then performed to remove portions of the gate metal layer, photosensitive layer, insulative layer, and semiconductive layer not underlying the second patterned mask. A solvent is then employed to remove the second pattern mask and exposed portions of the remaining photosensitive layer. In the process of removing the exposed portions of the remaining photosensitive layer, overhanging portions of the gate metal layer are also removed.

A completed, electrically isolated top-gate TFT with self-aligned channel and gate electrode and relatively narrow channel width (especially compared to existing patterned-print devices) is thereby produced.

BRIEF DESCRIPTION OF THE DRAWINGS

These and other objects, features, and advantages of the present invention will become apparent from the following detailed description and the appended drawings in which like reference numerals denote like elements between the various drawings. Note that drawings are not to scale.

DETAILED DESCRIPTION OF THE INVENTION

Figure 1:
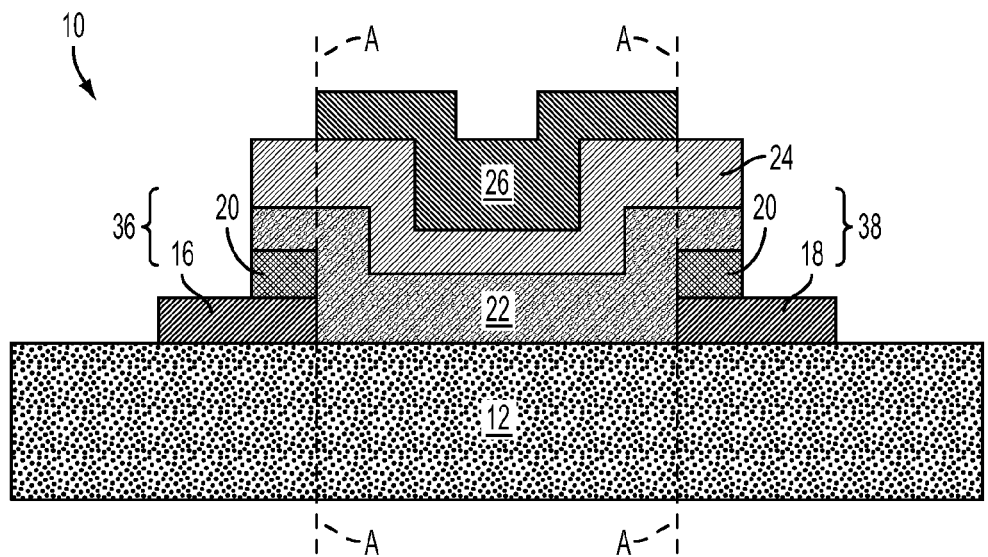
FIG. 1 is an exposed profile view of a complete top-gate thin-film transistor according to one embodiment of the present invention.

FIG. 1 is an illustration of a completed TFT device according to the teachings of the present invention. Following its description, the process for producing same is described. While only a single device is shown and described herein, it will be readily appreciated that the device may be one of an array of such devices, together with other devices, formed on a common substrate, and the process described for making the device may readily be employed to form an array of such devices, as well as other devices, on a common substrate.

With reference to FIG. 1, TFT device 10 according to the present invention comprises a transparent substrate 12, such as fused silica glass, quartz, sapphire, MgO, etc. onto which is formed source electrode 16 and drain electrode 18 (the order of which may be reversed as application dictates). These electrodes are typically a conductive metal such as Cr, Al, Al/Cr or TiW/Al/Cr. Ohmic contact regions 20 are formed over these electrodes, typically of $n^+$-Si. A channel layer 22 is formed, typically of a-Si:H over the insulating regions 20 and between the source electrode 16 and drain electrode 18. The region of this channel layer 22 directly between the source electrode 16 and drain electrode 18 forms the channel for the TFT device. A gate insulator 24 such as $Si_3N_4$ is then formed over the channel layer 22. Finally, a gate electrode 26 is formed over insulator 24. As illustrated in FIG. 1 by the dashed lines A-A, the source/drain and channel/gate are self-aligned. That is, the length of the gate electrode 26, otherwise known as the channel length, matches the distance between the source electrode 16 and drain electrode 18.

Figure 2:
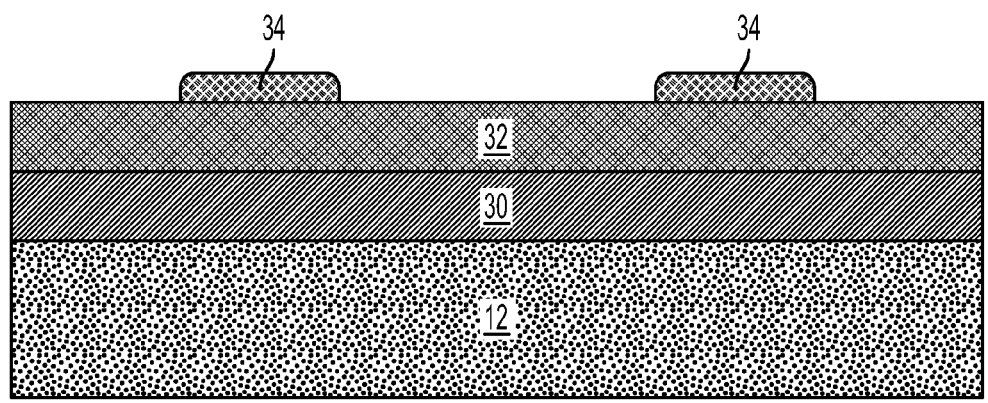
FIG. 2 is an exposed profile view of a partially completed top-gate thin-film transistor according to one embodiment of the present invention.

With reference now to FIGS. 2 though 12, the process for forming the aforementioned device will now be described. FIGS. 2 through 11 illustrate a device at several intermediate stages of its production according to a process illustrated in FIG. 12. While the following description makes specific reference to the device illustrated in FIGS. 2 through 11, without making more specific reference thereto the description is following the sequence illustrated in FIG. 12. The process for forming a top-gate, self-aligned TFT according to the present invention begins with the preparation, primarily cleaning, of a suitable transparent substrate 12. The substrate must be transparent, as subsequent steps in the process involve exposure of photoresist through the substrate, so-called back side exposure. A layer 30, for example comprised of Cr, is first deposited on substrate 12. (Here and throughout this description and claims, reference to forming or depositing one layer onto another or onto a substrate or structure is meant to include both directly forming same thereon with no layers therebetween, as well as forming same indirectly thereon with one or more layers formed therebetween.) This layer may be deposited by physical vapor deposition, such as sputtering, evaporation or other methods well known in the art. Furthermore, layer 30 may be formed of materials other than Cr, as may be appropriate for specific applications, the idea being that portions of layer 30 will become the source and drain electrodes. An ohmic contact layer 32, for example comprised of $n^+$-Si, is next deposited onto layer 30.

Masking material region 34 is then formed on the surface of layer 32 by digital lithography. Importantly, the masking material of region 34 is deposited in a pattern which will be employed in a subsequent etching step. For example, the masking material may be the aforementioned stearyl erucamide wax, maintained in liquid phase over an ink-jet style piezoelectric print head. The wax is selectively ejected on a droplet-by-droplet basis such that droplets of the wax are deposited in desired locations in a desired pattern on layer 32. The droplets exit the print head in liquid form, then solidify (generally with approximately a hemispherical topology) after impacting the layer, hence the material is referred to as phase-change. Substrate temperature control may be employed to control droplet size, as disclosed in the aforementioned U.S. Pat. Nos. 6,742,884 and 6,872,320. It will be readily appreciated that other techniques for depositing an etch mask pattern without the need to photolithographically pattern the mask, such as BAM, AIP, etc., may be employed at this stage of the process. Additionally, in many instances adhesion promoters of the type commonly used with photoresist materials in the semiconductor processing art provide improved adhesion of the mask material. For example, hexamethyldisilizane (HMDS) is used for chemically drying the substrate to promote adhesion. Other methods are annealing and plasma cleaning followed by an HMDS coating in order to clean and prepare the surface for photo resist adhesion.

In order to control and align the deposition of masking material, printed alignment marks (not shown), patterned from a previous mask layer may be used to coordinate the next overlying mask layer, as described in the aforementioned U.S. Pat. Nos. 6,742,884 and 6,872,320. An image processing system such as a camera may be used to capture the orientation of the previous mask layer. A processing system then adjusts the position of the overlying mask layer by altering the mask image file before actual printing of the mask layer. In this way, the substrate remains fixed and mechanical movement of the substrate holder is unnecessary. Instead positioning adjustment are accomplished in software and translated to movements of the masking material source. Alternatively, the position of the substrate holder (stage) may be adjusted relative to a fixed masking material source, under control of the processing system, in order to affect alignment.

Figure 3:
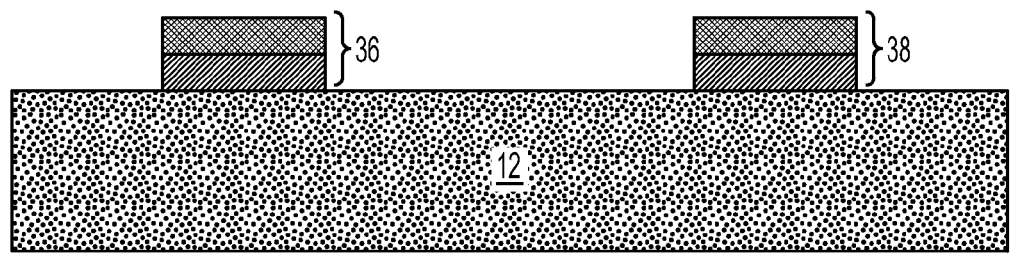
FIG. 3 is an exposed profile view of a top-gate thin-film transistor, further along in its manufacturing, according to one embodiment of the present invention.

With the mask material region 34 formed in the desired pattern, layers 30 and 32 are next removed by etching in all regions except where masked by patterned mask material region 34. Mask material region 34 is also removed. As shown in FIG. 3, the result is physically and electrically isolated structures which become the source electrode 36 and drain electrode 38 (In the case of an array of such devices, electrical connections thereto, not shown, are also formed). Accordingly, the dimensions of the source electrode 36 and drain electrode 38 are determined by the patterning of the masking material 34, and in the extreme their sizes are limited by the smallest droplet size which may be provided by the patterned-print deposition methods and devices employed, on the order of 20-40 microns. However, the spacing between the source electrode 36 and drain electrode 38 is determined by the movement of the stage supporting the substrate (or alternatively, by the incremental movement of the print head in moving-print head systems). This is important because this inter-electrode distance is, as will be further described, the channel length which is ideally less that 10-15 microns. Therefore, the current invention provides a technique for obtaining sizes of features, such as channel length, which are smaller than the mask droplet size.

Figure 4:
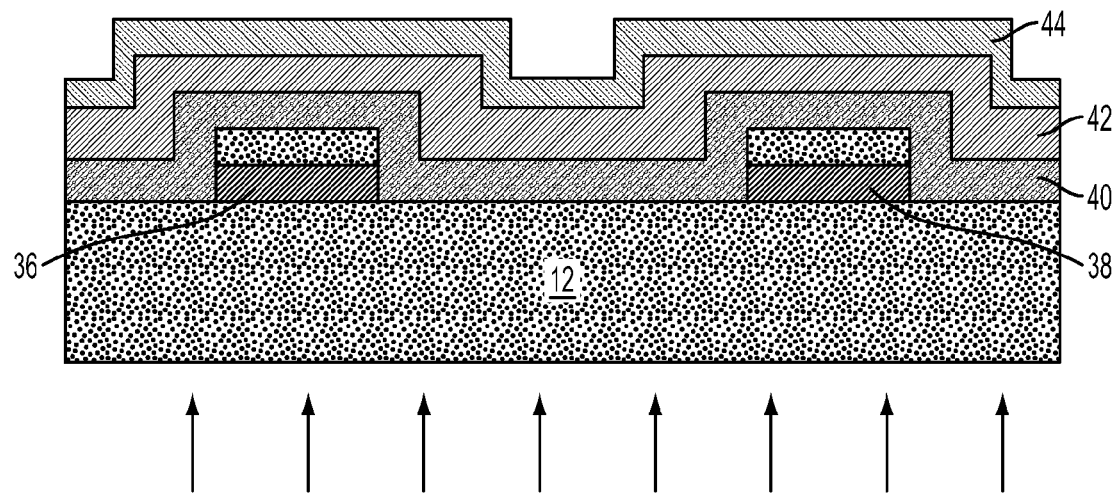
FIG. 4 is an exposed profile view of a top-gate thin-film transistor, still further along in its manufacturing, according to one embodiment of the present invention.

With reference now to FIG. 4, a semiconductive layer 40, such as a-Si:H is next formed over the substrate and source electrode 36 and drain electrode 38 (as well as any interconnections, not shown, formed at this point which may be required). Methods for depositing this layer are well understood, and include sputtering, plasma-enhanced chemical vapor deposition (PECVD), etc. By similar know processes, an insulative layer 42, such as $Si_3N_4$, is then deposited over semiconductive layer 40.

Figure 5:
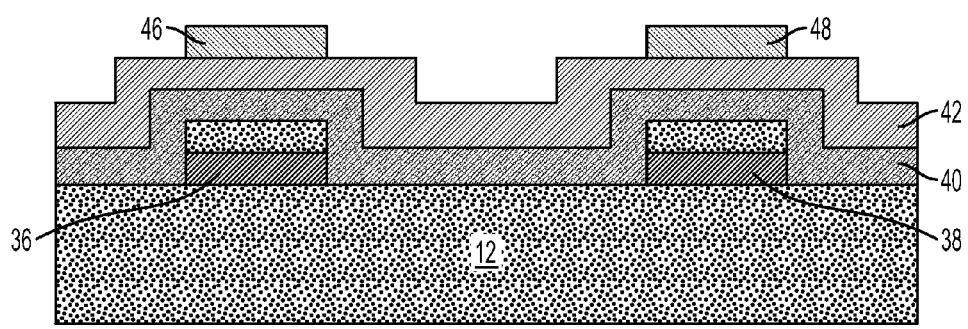
FIG. 5 is an exposed profile view of a top-gate thin-film transistor, at a later stage in its manufacturing, according to one embodiment of the present invention.

A layer 44 of positive photoresist is next deposited over the structure of a type, and by means, well known in the art. Photoresist layer 44 is then exposed, typically to UV light, from the back side of the device by illuminating through the transparent substrate. In so doing, the source electrode 36 and drain electrode 38 act as masks, preventing exposure of regions of the photoresist layer 44 directly thereabove. Subsequent development of the photoresist layer 44 removes the exposed photoresist material, leaving the unexposed photoresist material as islands 46 and 48 above insulative layer 42 and directly above source electrode 36 and drain electrode 38, respectively. The structure at this point is shown in FIG. 5.

Figure 6:
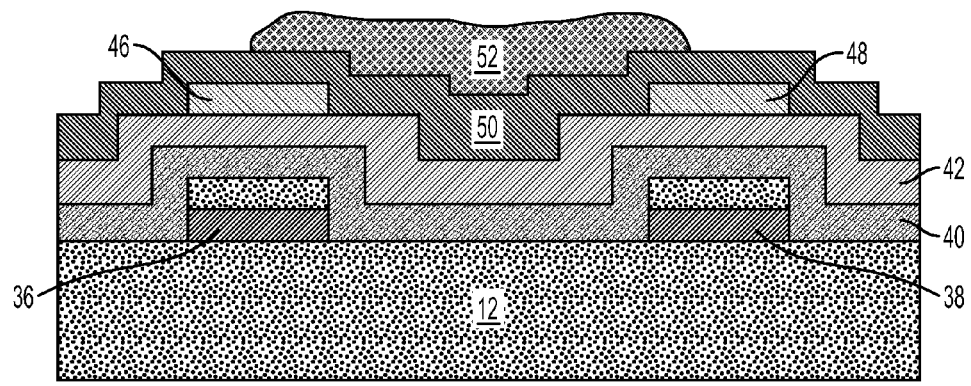
FIG. 6 is an exposed profile view of a top-gate thin-film transistor, at a still later stage in its manufacturing, according to one embodiment of the present invention.

With reference now to FIG. 6, a gate metal layer 50 is next deposited over the structure, effectively encasing photoresist islands 46 and 48. Gate metal layer 50 is typically Cr, but may be another conductive metal, alloy or a multiplicity of sublayers as dictated by manufacturing and application of the device. Typically, this layer will be sputter-deposited, although plating and other techniques may be employed instead, as further described herein below. A final mask region 52 is then formed on the surface of gate metal layer 50. Once again, this mask region is formed of a phase-change material such as wax, deposited by a patterned-print technique such as ink-jet, BAM, AIP, etc. Importantly, no photolithography of this masking material is required to obtain the desired mask pattern. Mask region 52 overlies part of the source electrode 36 and drain electrode 38.

Figure 7:
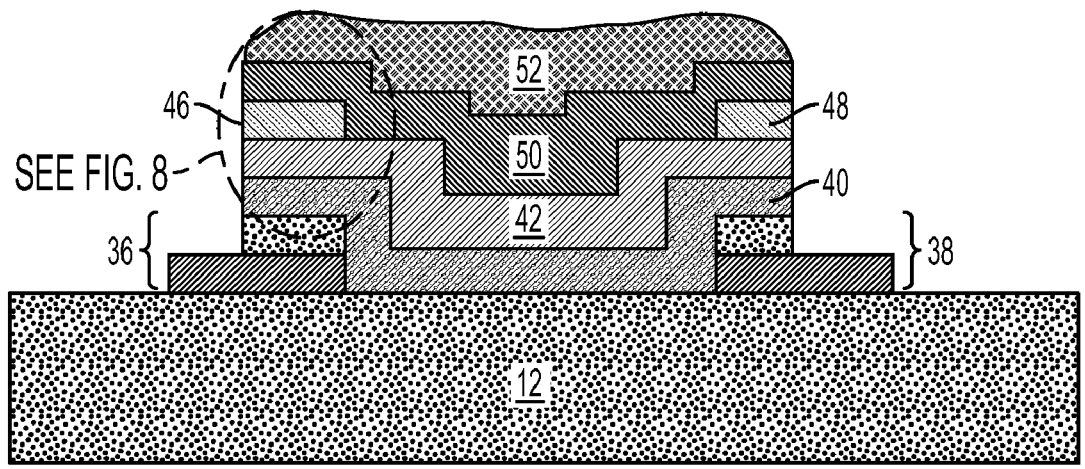
FIG. 7 is an exposed profile view of a top-gate thin-film transistor according to one embodiment of the present invention near completion.

With reference to FIG. 7, the structure is next etched (typically anisotropically) using the mask region 52 to mask over a portion of the underlying layers. Using a dry etch, for example, this step removes all layers, with the exception of the source electrode 36 and drain electrode 38, other than where masked by region 52.

Figure 8:
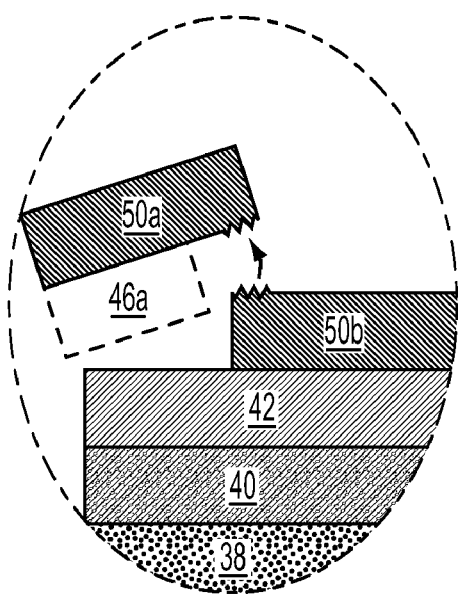
FIG. 8 is a magnified view of a portion of a top-gate thin-film transistor illustrating lift-off according to the teachings of the present invention.

A solvent such as tetrahydrofuran or other solvent known to the art is next employed, serving several ends. First, the solvent removes the mask region 52. Second, by exposing the ends of the photoresist regions 46 and 48 during the previous etch step, points of attack are created such that the solvent may effectively remove most or all of the photoresist material from these regions. In so doing, mechanical support for regions of gate metal layer 50 located directly above the photoresist regions 46 and 48 is removed, sufficiently weakening those regions so that they detach from the remainder of the layer with the solvent bath. For example, the portion of FIG. 7 magnified in FIG. 8 illustrates that with the material located in photoresist region 46 dissolved, leaving a void 46a in its place, the portion 50a of gate metal layer 50 lying over void 46a literally breaks away from the supported region 50b of gate metal layer 50 due to lack of mechanical support. The material from region 50a may then be simply rinsed away with the solvent and dissolved photoresist. This last step is often referred to as a "lift-off" process, with the photoresist regions 46 and 48 serving as the lift-off layer.

Figure 9:
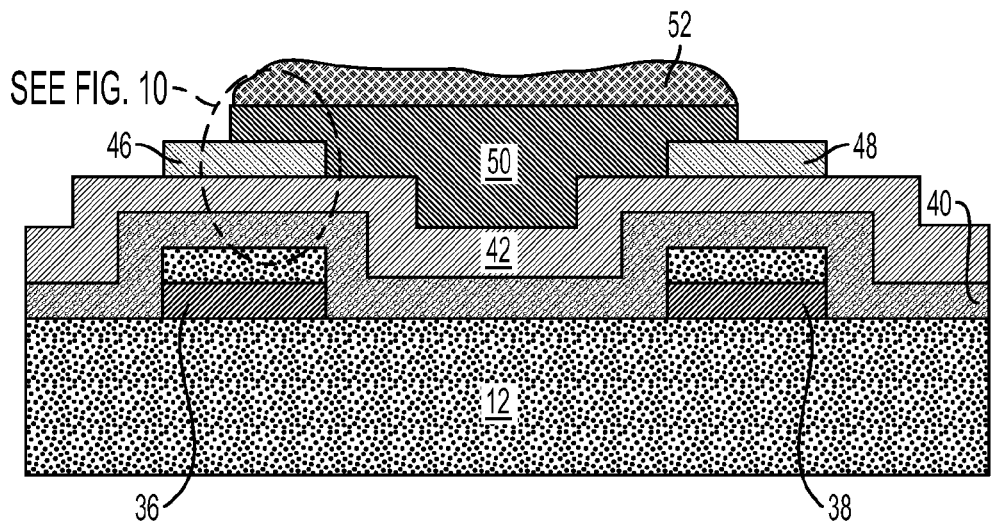
FIG. 9 is an exposed profile view of a top-gate thin-film transistor according to another embodiment of the present invention near completion.
Figure 10:
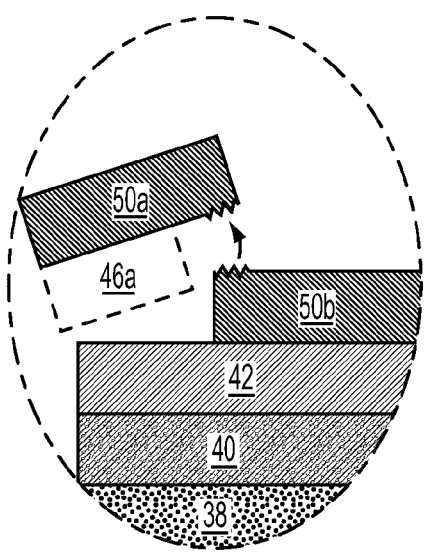
FIG. 10 is a magnified view of a portion of a top-gate thin-film transistor according to another embodiment of the present invention illustrating the lift-off process.
Figure 11:
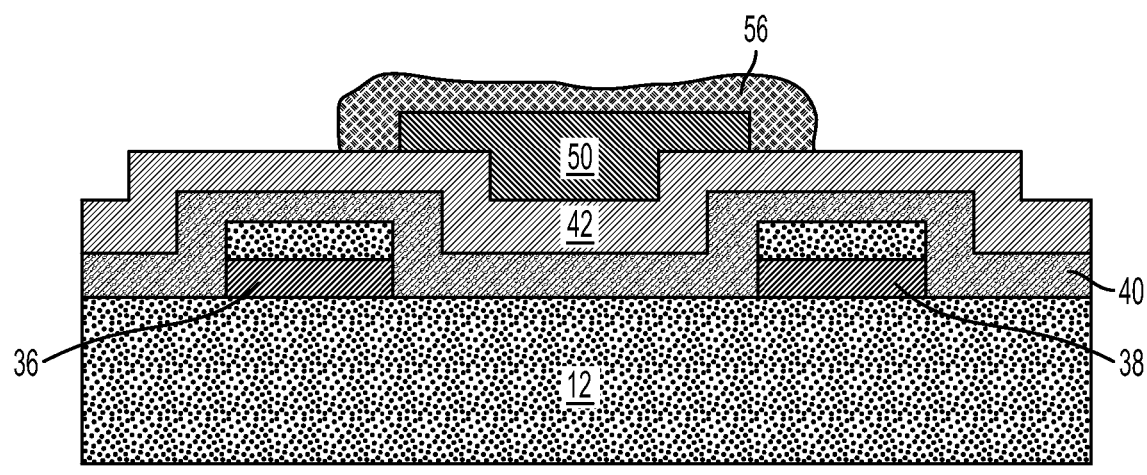
FIG. 11 is an exposed profile view of a top-gate thin-film transistor, at a still later stage in its manufacturing, according to another embodiment of the present invention.
Figure 12:
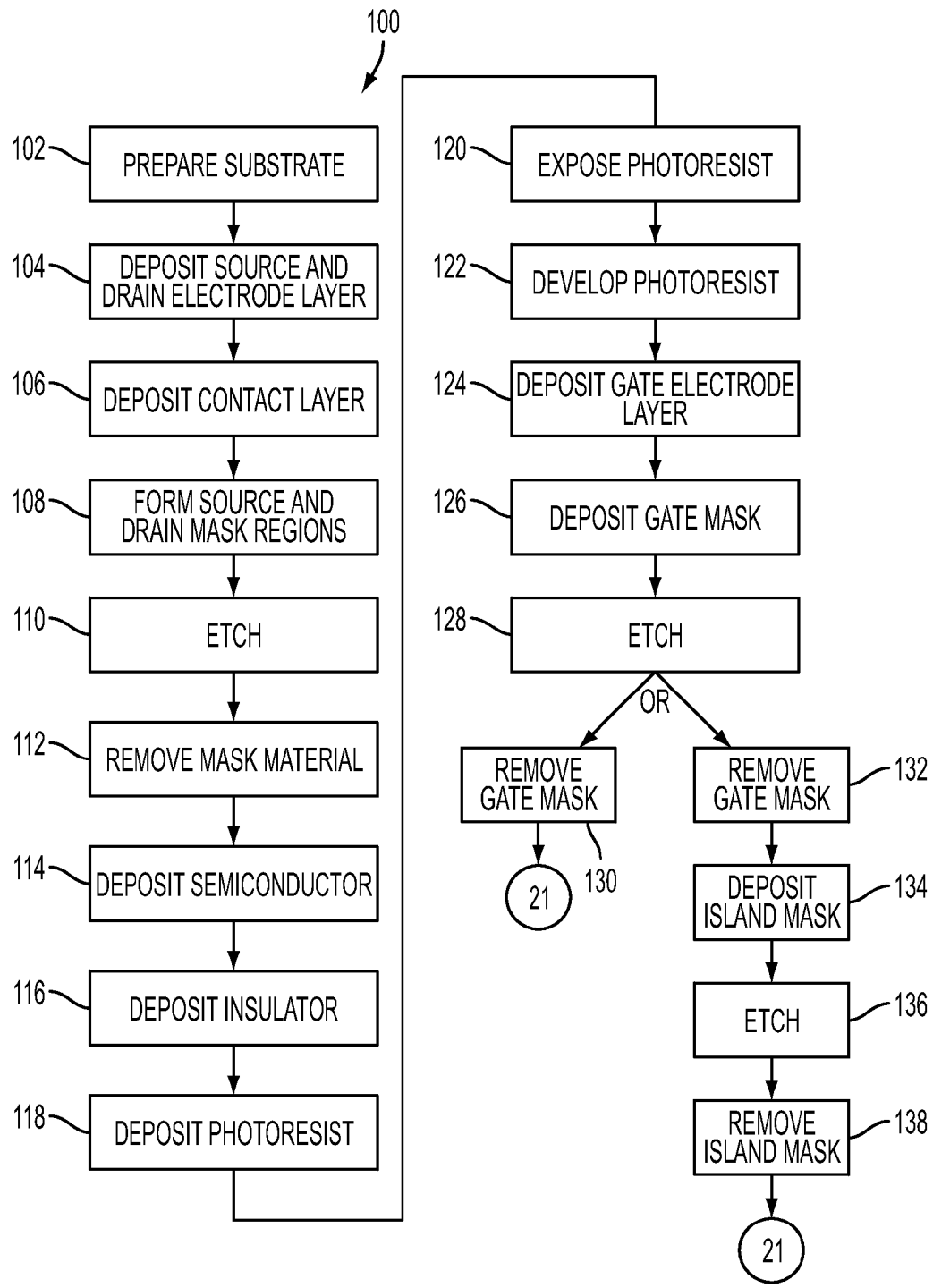
FIG. 12 is a flow diagram showing the steps of fabricating a top-gate thin-film transistor according to one embodiment of the present invention.

According to another embodiment of the present invention, the structure essentially as illustrated in FIG. 6 is selectively etched to remove those portions of gate metal layer 50 not underlying gate mask region 52. The resulting structure is essentially as shown in FIG. 9. A solvent such as tetrahydrofuran or other solvent known to the art is employed, which again removes material from mask region 52 as well as dissolves photoresist in regions 46 and 48 facilitating the lift-off process, essentially as illustrated in the magnified view of FIG. 10. Island masking region 56 is then formed by digital lithography over gate metal 50 and insulative layer 42, as shown in FIG. 11. Etching is then performed to remove material from all layers but source and drain regions 36 and 38 and those regions underlying masking region 56, as shown in FIG. 11, and a solvent then employed to remove the material from masking region 56 to obtain a completed TFT.

The final TFT is as shown in FIG. 1, with that portion of the semiconductive layer 40 remaining referred to as channel layer 22, that portion of insulative layer 42 remaining referred to as gate insulator 24, and that portion of the gate metal layer 50 remaining referred to as gate electrode 26. Additional electrical interconnection (not shown) may also be formed to facilitate electrical communication with the source, drain, and gate of the completed TFT, as will be well understood.

Figure 13:
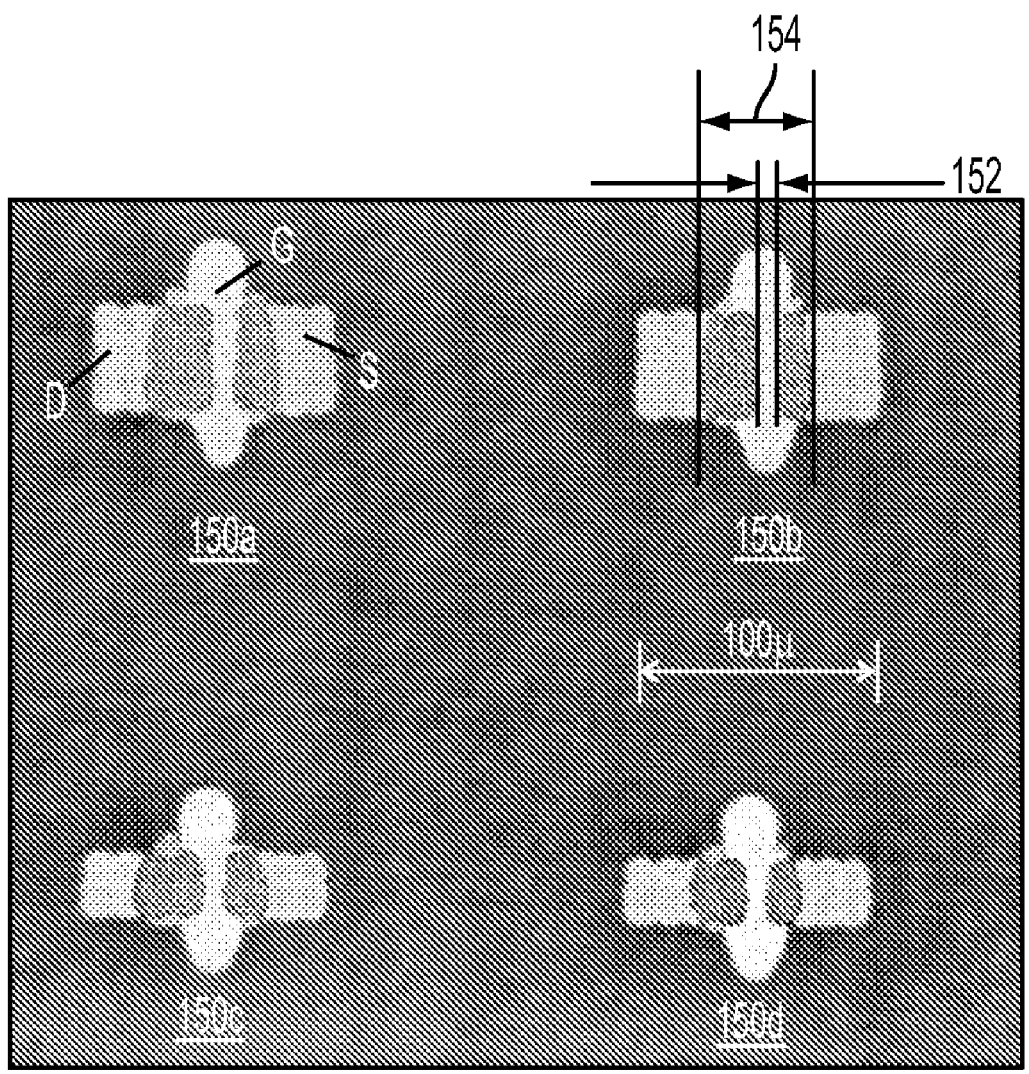
FIG. 13 is a micrograph showing several top-gate thin-film transistors fabricated according to one embodiment of the present invention.

FIG. 13 shows an optical micrograph of completed TFT structures 150a, 150b, 150c, and 150d fabricated according to the present invention. Focusing on a representative structure 150b, it can be seen that the channel length 152 is on the order of 10 to 15 microns, while the droplet width, indicated by the width of the masked region 154, is on the order of 40 to 50 microns. In general, the present invention provides a technique to obtain devices with feature sizes as small as one-fifth the diameter of the deposited mask droplets.

Figure 14:
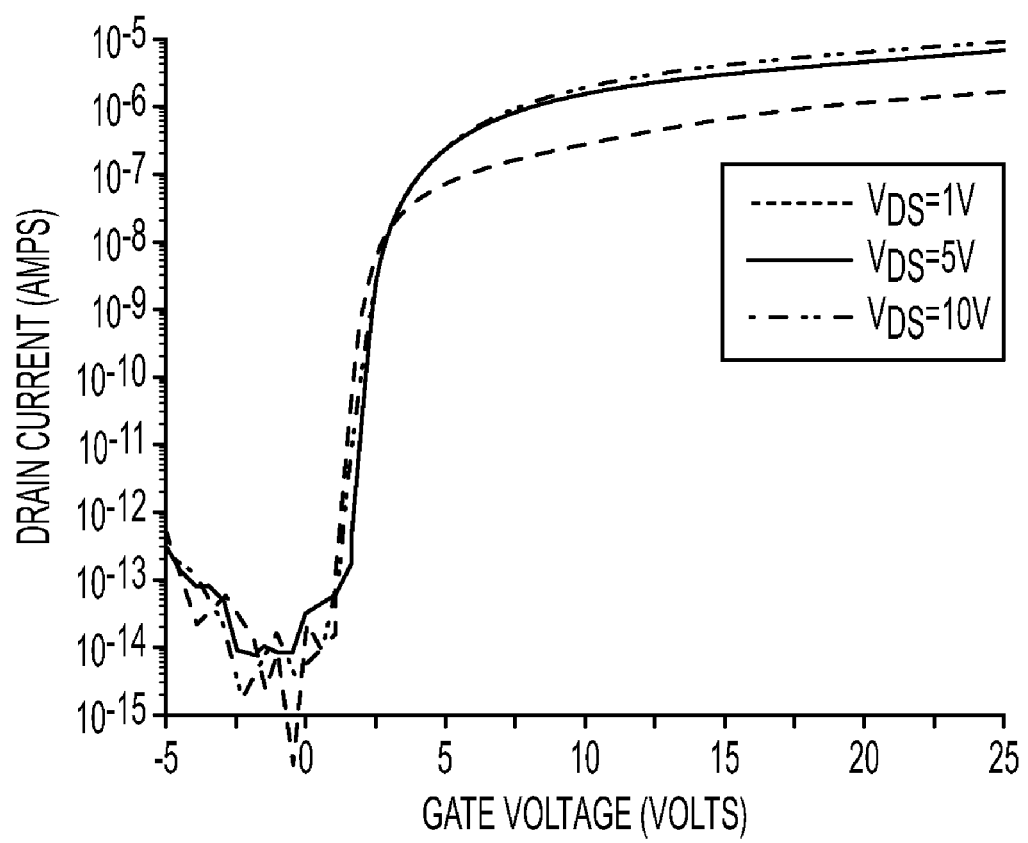
FIG. 14 is an I-V plot illustrating the performance characteristics of a top-gate thin-film transistor manufactured according to one embodiment of the present invention.

FIG. 14 is an I-V plot illustrating the voltage-current performance of an exemplary device according to the present invention. It will be appreciated that the performance of the top-gate TFT according to the present invention is comparable to traditional bottom gate devices currently known in the art.

Figure 15:
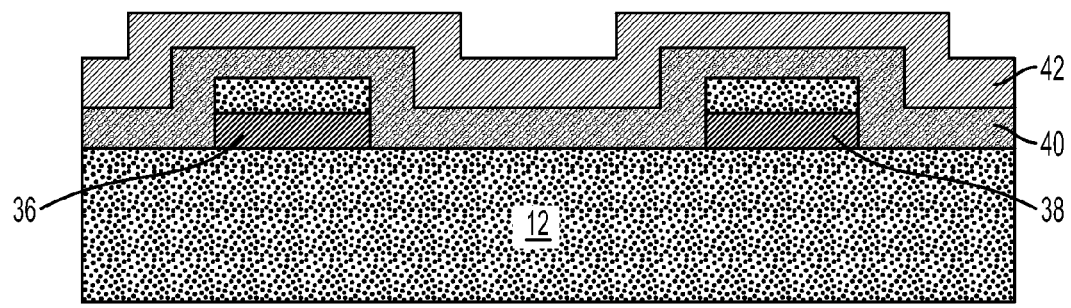
FIG. 15 is an exposed profile view of a partially completed top-gate thin-film transistor according to a second embodiment of the present invention.
Figure 16:
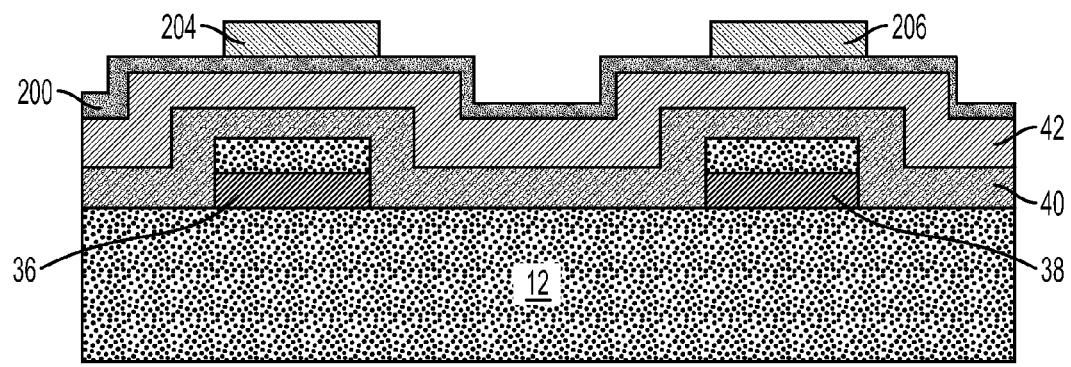
FIG. 16 is an exposed profile view of a top-gate thin-film transistor, further along in its manufacturing, according to a second embodiment of the present invention.

According to another embodiment of the present invention, a TFT device may be fabricated by employing electro-plating in place of the previously described lift-off technique. According to this embodiment, the process proceeds essentially as previously described up to step 118 of FIG. 12. At this point, the structure appears essentially as show in FIG. 15. Onto this structure is then deposited a transparent conductive layer 200, such as ITO, by sputtering or other methods known in the art. This transparent conductive layer serves as the required seed layer for future electro-plating. Onto the surface of layer 200 is deposited a layer 202 of positive photoresist of a type, and by means, well known in the art. Photoresist layer 202 is then exposed, typically to UV light, from the back side of the structure by illuminating through the transparent substrate. In so doing, the source electrode 36 and drain electrode 38 act as masks, preventing exposure of regions of the photoresist layer 202 directly thereabove. Subsequent development of the photoresist layer 202 produces islands of photoresist 204 and 206 above transparent conductive layer 200 and directly above source electrode 36 and drain electrode 38, respectively. This structure at this point is shown in FIG. 16.

Figure 17:
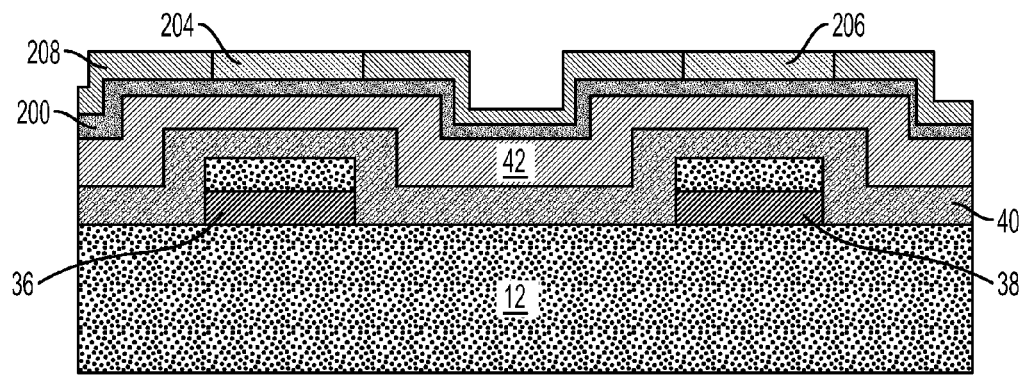
FIG. 17 is an exposed profile view of a top-gate thin-film transistor, still further along in its manufacturing, according to a second embodiment of the present invention.

With reference now to FIG. 17, photoresist regions 204 and 206 serve as plating masks due to their low electrical conductivity. A Ni (or similar metal) layer 208 is then electro-plated onto the transparent conductive layer 200 except in regions 204 and 206.

According to a further embodiment of the present invention, electro-less plating is employed to deposit metal layer 208. Electro-less plating does not require an external voltage source to deposits thin films and can be performed with or without an electrically conductive seed layer, such as a transparent conductive layer. Accordingly, structures in which electro-less plating is employed may not include transparent conductive layer 200. In either event, metal layer 208 is deposited except in regions 204 and 206.

Figure 18:
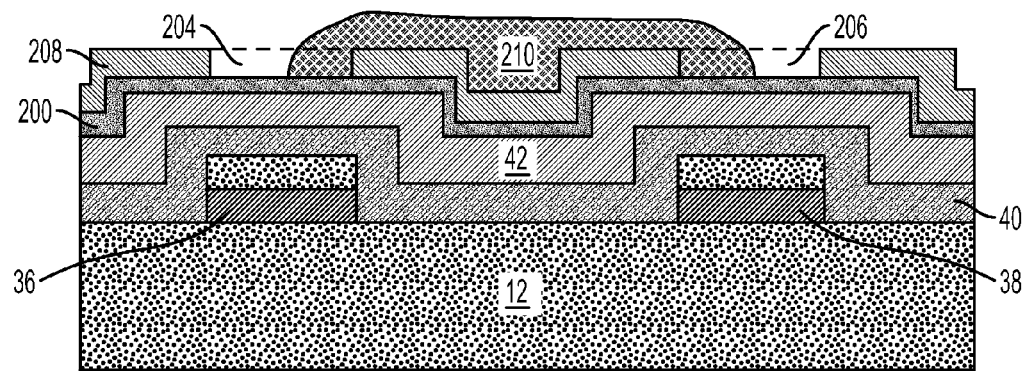
FIG. 18 is an exposed profile view of a top-gate thin-film transistor, at a later stage in its manufacturing, according to a second embodiment of the present invention.
Figure 19:
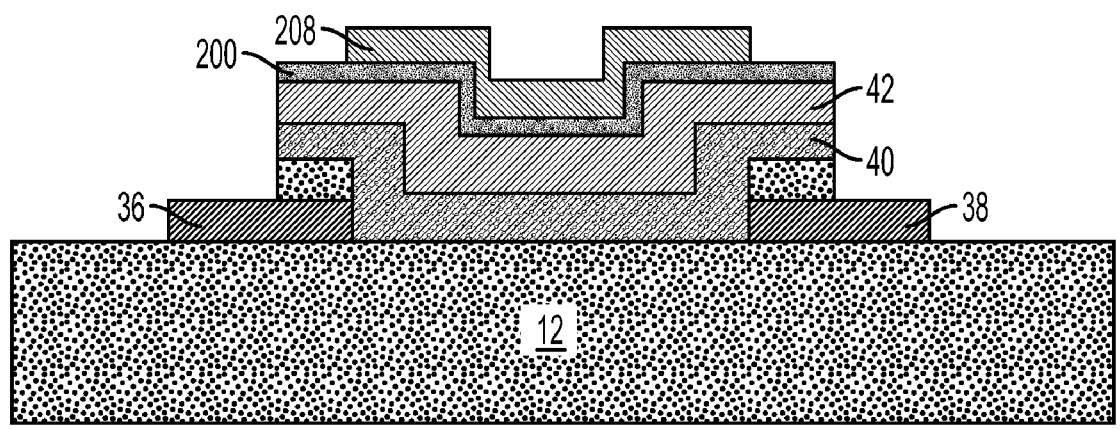
FIG. 19 is an exposed profile view of a complete top-gate thin-film transistor according to a second embodiment of the present invention.
Figure 20:
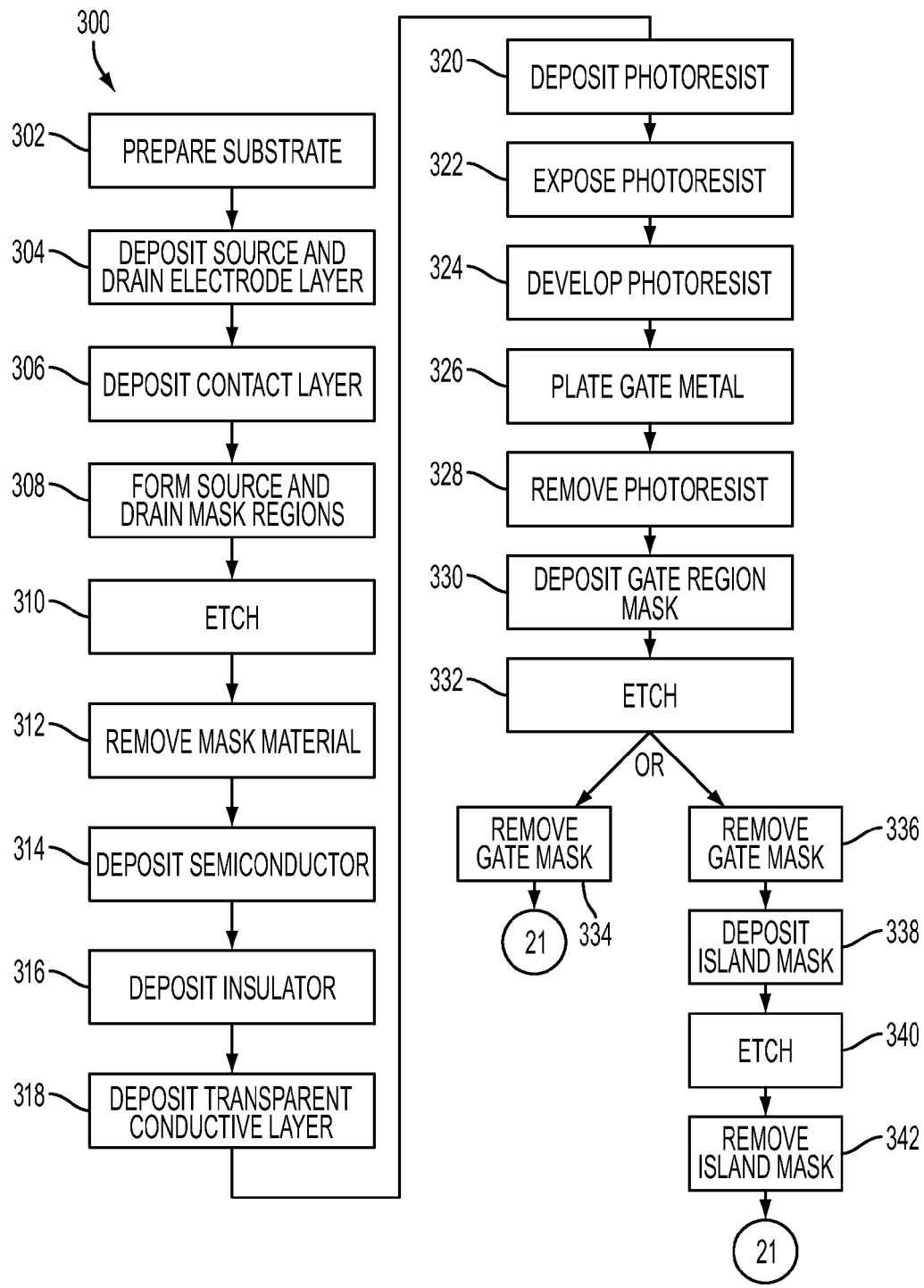
FIG. 20 is a flow diagram showing the steps of fabricating a top-gate thin-film transistor according to a second embodiment of the present invention.

FIG. 18 illustrates the results of the next steps in the process of forming a TFT according to this embodiment of the present invention. First, photoresist in regions 204 and 206 is removed in a solvent bath or other method well understood in the art. Gate mask region 210 is then formed by digital lithography on portions of the surface of gate metal layer 208, overlapping into regions 304 and 206, and in so doing overlapping part of the source electrode 36 and drain electrode 38. Once again, this mask region is formed of a phase-change material such as wax, deposited by a patterned-print technique such as ink-jet, BAM, AIP, etc. Importantly, no photolithography of this masking material is required to obtain the desired mask pattern. Material in mask region 210 is next used as an etch mask, with etching (typically anisotropically) performed to remove all material except that underlying the mask region 210, down to the source electrode 36 and drain electrode 38. A solvent bath may then be employed to remove the masking material from region 210. The final structure is substantially as shown in FIG. 19. The complete process is illustrated in the flow chart of FIG. 20. Additional electrical interconnection (not shown) may also be formed to facilitate electrical communication with the source, drain, and gate of the completed TFT, as will be well understood. One advantage of this embodiment is that the gate electrode may still be self-aligned, but the lift-off process is replaced with a plating process. Replacing the lift-off process is advantageous in those cases in which lift-off baths are difficult to maintain due to large particle accumulation. Other advantages of electro-less and electroplating include the ability to deposit thicker films as compared to sputtering (for reduced conductivity) and to accommodate very large substrates (difficult for sputtering). Electro-less plating directly onto dielectrics is particularly attractive as the sputter step for the seed layer is avoided all together.

Figure 21:
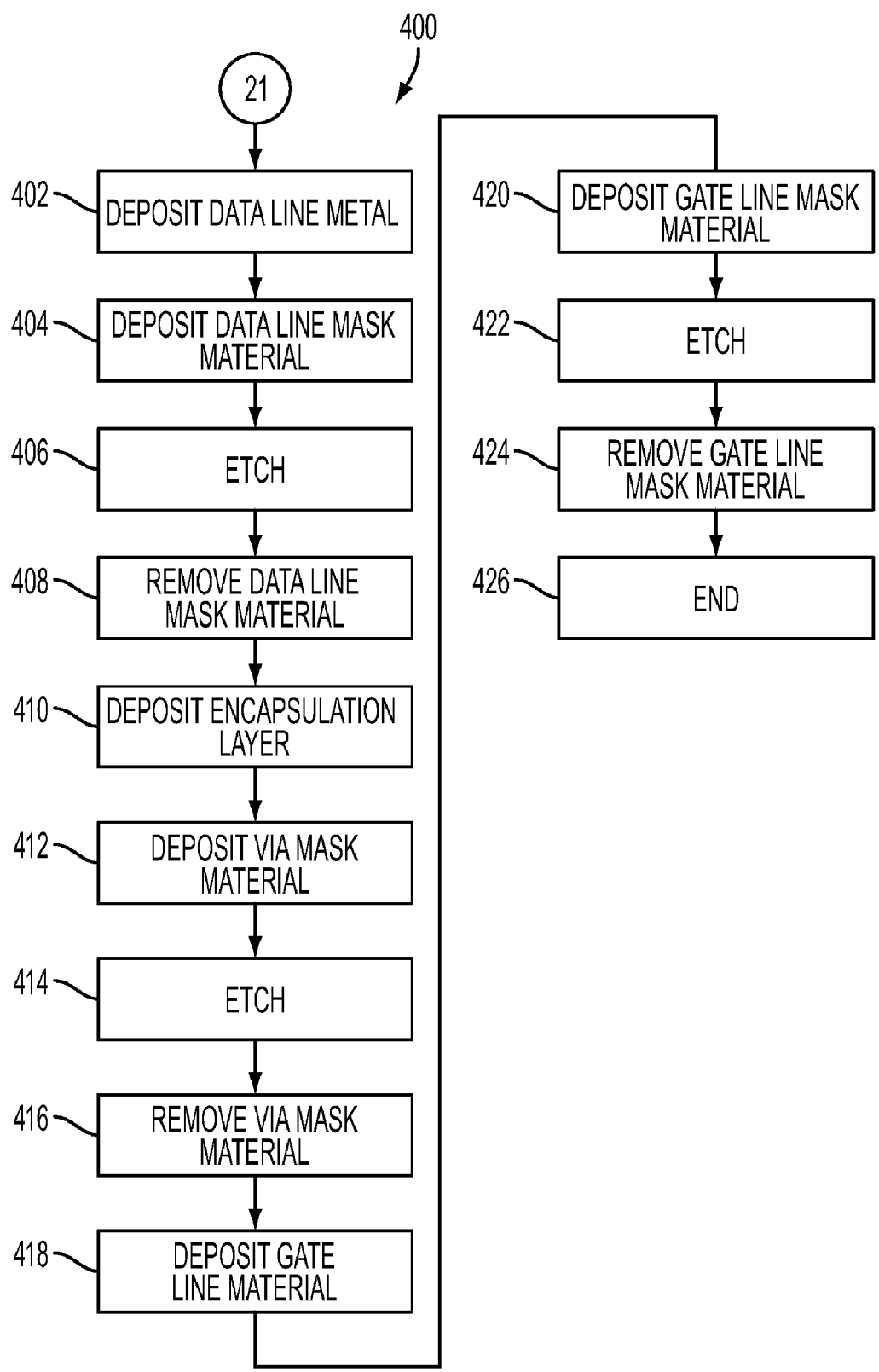
FIG. 21 is a flow diagram showing the steps of fabricating a top-gate thin-film transistor according to an embodiment of the present invention in which the transistor may form an element of an array of such transistors.

With reference now to FIG. 21, there is shown a flow chart illustrating the steps according to one embodiment of the present invention for the production of a TFT which may be one of an array of such devices formed on a common substrate. FIGS. 22 through 27 illustrate the structure resulting from the steps shown in FIG. 21. While the following description makes specific reference to the device illustrated in FIGS. 22 through 27, without making more specific reference thereto the description is following the sequence illustrated in FIG. 21. The process of FIG. 21 begins following the last step of the processes shown in either of FIG. 10 or 18, namely upon the completion of the removal of either the gate mask material (steps 130, 334) or the island mask material (steps 138, 342).

Figure 22:
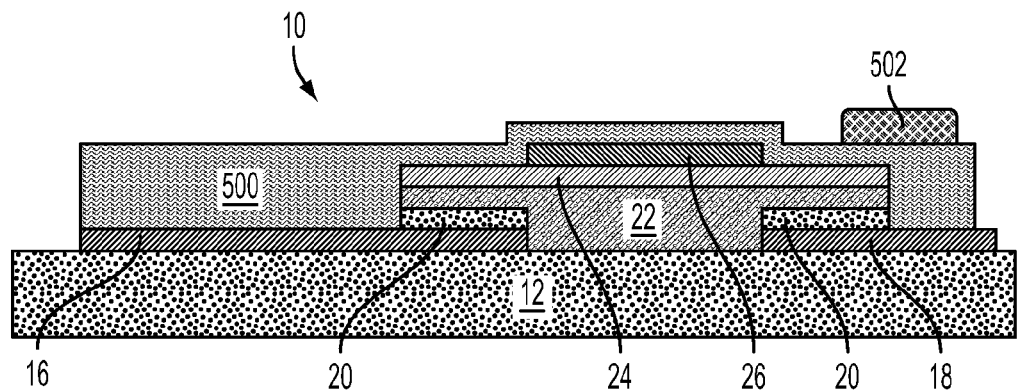
FIG. 22 is an exposed profile view of a partially completed top-gate thin-film transistor according to an embodiment of the present invention in which the transistor may form an element of an array of such transistors.
Figure 23:
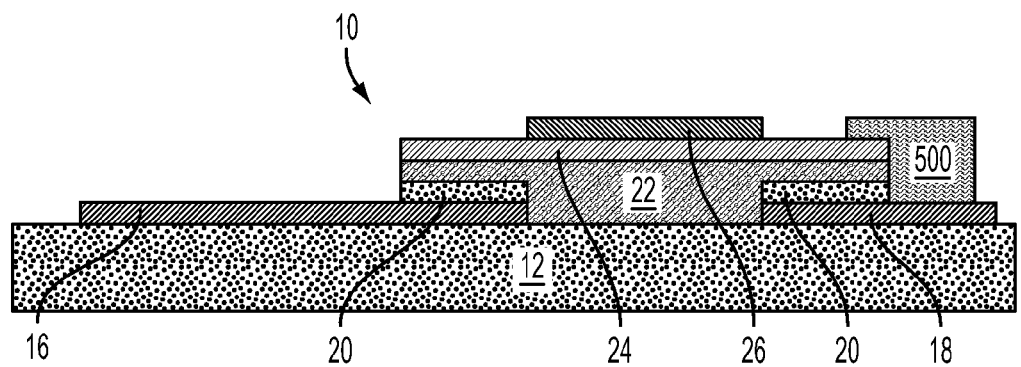
FIG. 23 is an exposed profile view of a top-gate thin-film transistor, further along in its manufacturing, according to an embodiment of the present invention in which the transistor may form an element of an array of such transistors.

With reference to FIG. 22, a data line metal layer 500 is first deposited over the completed device 10. For the purposes of this explanation, processing of a single device is described. However, it will be appreciated that in a single step, the processing of multiple such devices, such as might form an array of TFTs, may be accomplished. Data metal layer 500 is typically Cr, Al, Cr/Al, TiW/Al/Cr, and is typically deposited by PVD processes. A data line mask region 502 is next formed by digital lithography, for example depositing a phase-change material such as wax, by a patterned-print technique such as ink-jet, BAM, AIP, etc. Importantly, no photolithography of this masking material is required to obtain the desired mask pattern. Material in data line mask region 502 is next used as an etch mask, with selective etching performed to remove all of data line metal layer 500 except that underlying the mask region 502. A solvent bath may then be employed to remove the masking material from region 502. The device is as substantially shown in FIG. 23.

Figure 24:
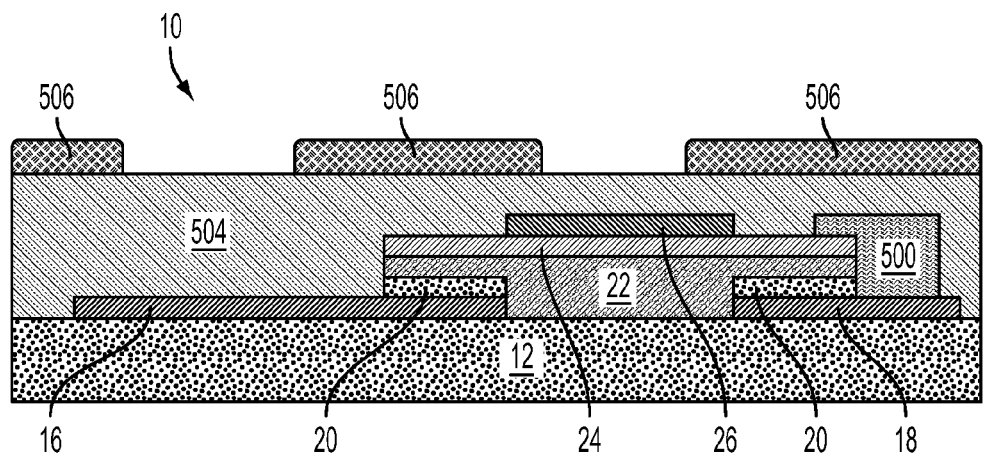
FIG. 24 is an exposed profile view of a top-gate thin-film transistor, still further along in its manufacturing, according to an embodiment of the present invention in which the transistor may form an element of an array of such transistors.
Figure 25:
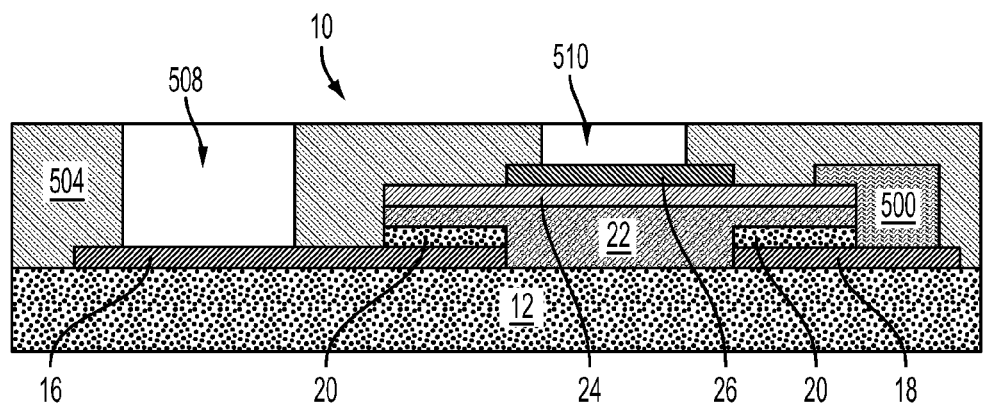
FIG. 25 is an exposed profile view of a top-gate thin-film transistor, at a later stage in its manufacturing, according to an embodiment of the present invention in which the transistor may form an element of an array of such transistors.
Figure 26:
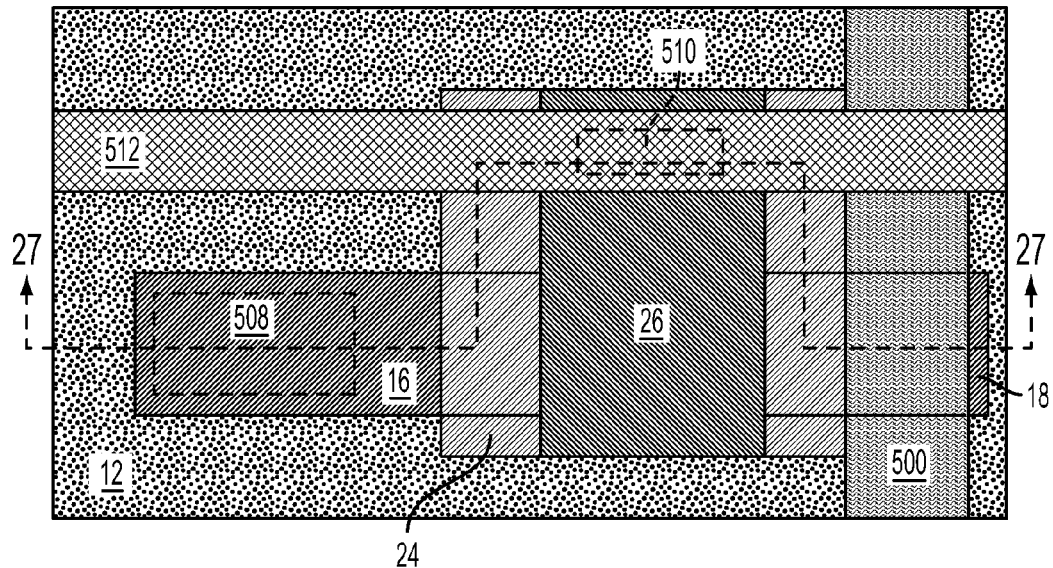
FIG. 26 is a plan view of a completed top-gate thin-film transistor according to an embodiment of the present invention in which the transistor may form an element of an array of such transistors.

Next, over the structure as formed, an encapsulation layer 504 is deposited. Encapsulation layer 504 serves as a insulator and is typically formed of a material such as oxynitride up to 1 micron in thickness. However, encapsulation layer 504 may also be on organic polymer, photo-curable insulator, or other similar material as appropriate for the particular application and process employed. Atop encapsulation layer 504 is formed via mask regions 506 of a material deposited by digital lithography. The structure at this point is as shown in FIG. 24.

Figure 27:
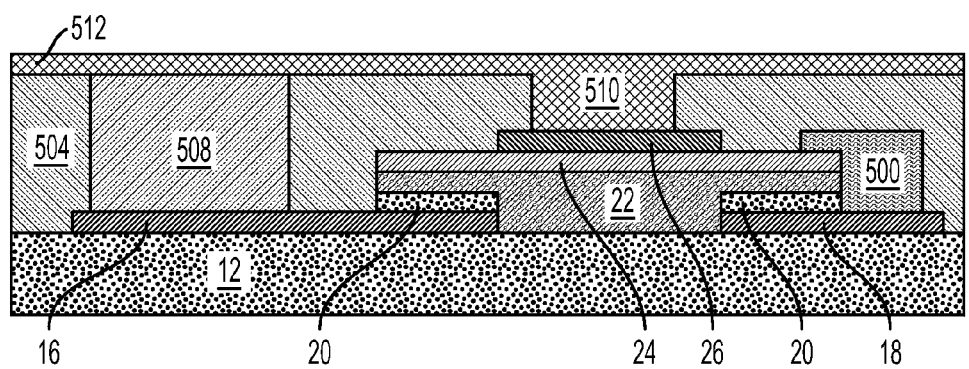
FIG. 27 is a cut-away view of the completed top-gate thin-film transistor shown in FIG. 26 according to an embodiment of the present invention in which the transistor may form an element of an array of such transistors.

Anisotropic etching is then performed to open a pixel pad via 508 to drain electrode 16 and a gate line via 510 to gate electrode 26. Material in via mask regions 506 are then removed by etching as heretofore described. Gate line metal 512 is next deposited over the entire structure. According to one embodiment, gate line metal 512 is a metal different from the metal forming source, drain, and gate electrodes, as a subsequent etch step must selectively etch the former but not the later. Alternatively, a conductive etch stop layer (not shown, but well understood in the art) may be deposited prior to depositing the gate line metal 512 on the structure in all locations in order to permit the subsequent selective etching. Masking material is next deposited in gate line masking region 514 by digital lithography to overlay a portion of the gate electrode 26 for forming a gate line 516 (FIG. 27). Etching is next performed to remove gate line metal 512 except where overlaid by gate line masking region 514. Masking material in gate line masking region 514 is then removed to obtain the structure shown in top view in FIG. 26 and cut-away view in FIG. 27.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the invention in any way. For example, while the primary embodiment of the present invention is a process for manufacturing a self-aligned, top-gate, a-Si:H thin-film transistor, other devices may be produced by equivalent or similar processes without altering the nature of the present invention. Such other devices include but are not limited to diodes, resistors, capacitors, and other similar discrete circuit devices. In addition, the devices described herein include a semiconductive layer of a-Si:H, but such semiconductive layer may be other material as suits the particular application and process for producing the device. Accordingly, the foregoing detailed description provides those of ordinary skill in the art with a convenient guide for implementation of embodiments of the invention, and the inventors hereof contemplate that various changes in the functions and arrangements of the described embodiments may be made without departing from the spirit and scope of the invention defined by the claims thereto.

What is claimed is:

1. A structure comprising:
a substantially transparent substrate;
a source electrode and a drain electrode layer formed over at least a portion of said substrate; and
a patterned phase change material etch mask formed over said source electrode and said drain electrode layer so as to form a source electrode etch mask and drain electrode etch mask, said source electrode etch mask and drain electrode etch mask spaced apart by between 5 and 15 micrometers.

2. The structure of claim 1, wherein said substantially transparent substrate is selected from the group consisting of: fused silica glass, quartz, sapphire, and magnesium oxide (MgO).

3. The structure of claim 1, further comprising an ohmic contact layer disposed over and in contact with said source electrode and a drain electrode layer and further wherein said patterned phase change material etch mask is formed over and in contact with said ohmic contact layer.

4. The structure of claim 3, wherein said ohmic contact layer is comprised of $n^+$-Si.

5. The structure of claim 3, wherein said phase change material is of the type that may be ejected, in the form of liquid droplets, in a pattern onto said ohmic contact layer, the droplets at least partially changing from liquid to solid phase after contact with said ohmic contact layer to thereby form said patterned etch mask.

\* \* \* \* \*